United States Patent [19]

Yasuda

[11] Patent Number: 5,381,053

[45] Date of Patent: Jan. 10, 1995

[54] VOLTAGE COMPARATOR CIRCUIT CAPABLE OF AVOIDING ERRONEOUS OPERATION

[75] Inventor: Susumu Yasuda, Tokyo, Japan

[73] Assignee: NEC Corporation, Tokyo, Japan

[21] Appl. No.: 126,383

[22] Filed: Sep. 24, 1993

[30] Foreign Application Priority Data

Sep. 29, 1992 [JP] Japan .................. 4-259189

[51] Int. Cl.⁶ .............................................. H03K 5/24
[52] U.S. Cl. .................................. 327/65; 327/77; 327/91
[58] Field of Search ............... 302/572, 362, 352, 353, 302/355, 494; 328/151

[56] References Cited

U.S. PATENT DOCUMENTS

| | | | |
|---|---|---|---|
| 4,845,383 | 7/1989 | Iida | 302/355 |
| 5,113,090 | 5/1992 | Imaizumi et al. | 302/494 |
| 5,148,054 | 9/1992 | Demler | 302/355 |
| 5,262,686 | 11/1993 | Kurosawa | 302/494 |

OTHER PUBLICATIONS

T. Matsuura et al: "An 8b 20 MHz CMOS Half-Flash A/D Converter", ISSCC Digest of Technical Papers, pp. 220-221, Feb., 1988.

Primary Examiner—Timothy P. Callahan
Assistant Examiner—Dinh Le

[57] ABSTRACT

A reference voltage terminal and an input voltage terminal are connected via a first capacitor to a first electrode of a differential amplifier. Also, the reference voltage terminal and the input voltage terminal are connected via a second capacitor to a second electrode of a differential amplifier. The first capacitor samples a difference Vref−Vin in potential between the reference voltage terminal (Vref) and the input voltage terminal (Vin), and the second capacitor samples a difference Vin−Vref in potential between the reference voltage terminal and the input voltage terminal. Thus, the differential amplifier amplifies 2×(Vref−Vin).

10 Claims, 5 Drawing Sheets

Fig. 1 PRIOR ART
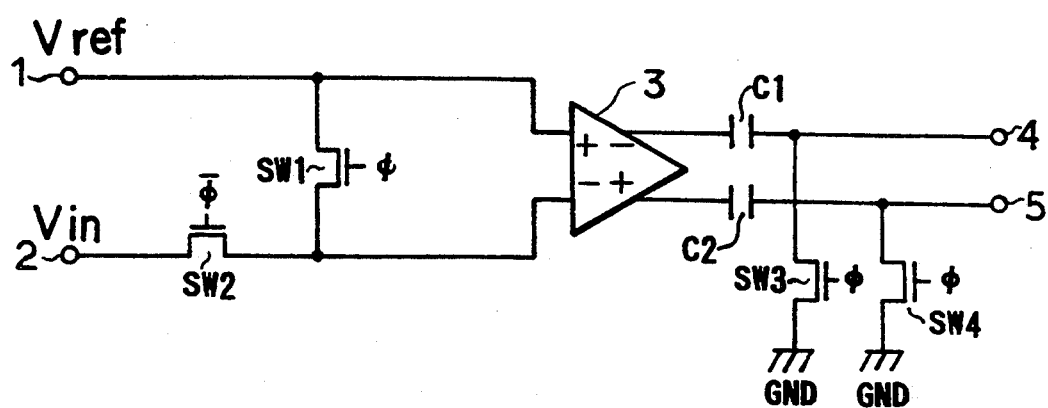
Fig. 2A
Fig. 2B

VOLTAGE COMPARATOR CIRCUIT CAPABLE OF AVOIDING ERRONEOUS OPERATION

BACKGROUND OF THE INVENTION

1. Field of the Invention

The present invention relates to a voltage comparator circuit that can avoid erroneous operation due to noise or an offset voltage.

2. Description of the Related Art

A prior art voltage comparator circuit includes a differential amplifier for amplifying a difference in potential between a reference voltage Vref and an input voltage Vin. That is, the differential amplifier directly amplifies a difference in potential Vref−Vin, which will be explained later in detail.

In the prior art voltage amplifier, however, when the difference Vref−Vin is very small and noise is superposed onto the difference, the differential amplifier may be erroneously operated. Also, if an offset voltage generated in the output of the differential amplifier is superposed thereon, the differential amplifier may operate erroneously.

SUMMARY OF THE INVENTION

It is an object of the present invention to provide a voltage comparator circuit which can avoid erroneous operation due to noise or an offset voltage.

According to the present invention, a reference voltage terminal and an input voltage terminal are connected via a first capacitor to a first electrode of a differential amplifier. Also, the reference voltage terminal and the input voltage terminal are connected via a second capacitor to a second electrode of a differential amplifier. The first capacitor samples a difference in potential Vref−Vin between the reference voltage terminal(Vref) and the input voltage terminal(Vin), and the second capacitor samples a difference in potential Vin−Vref between the reference voltage terminal and the input voltage terminal. Thus, the differential amplifier amplifies 2×(Vref−Vin). Therefore, the sensitivity of the differential amplifier to noise applied to the inputs thereof and the offset voltage of the output thereof is reduced compared to the prior art voltage comparator circuit.

BRIEF DESCRIPTION OF THE DRAWINGS

The present invention will be more clearly understood from the description as set forth below, in comparison with the prior art, with reference to the accompanying drawings, wherein:

FIG. 1 is a circuit diagram illustrating a prior art voltage comparator circuit;

FIGS. 2A and 2B are timing diagrams showing the clock signals in FIG. 1;

DESCRIPTION OF THE PREFERRED EMBODIMENTS

Figure 3:
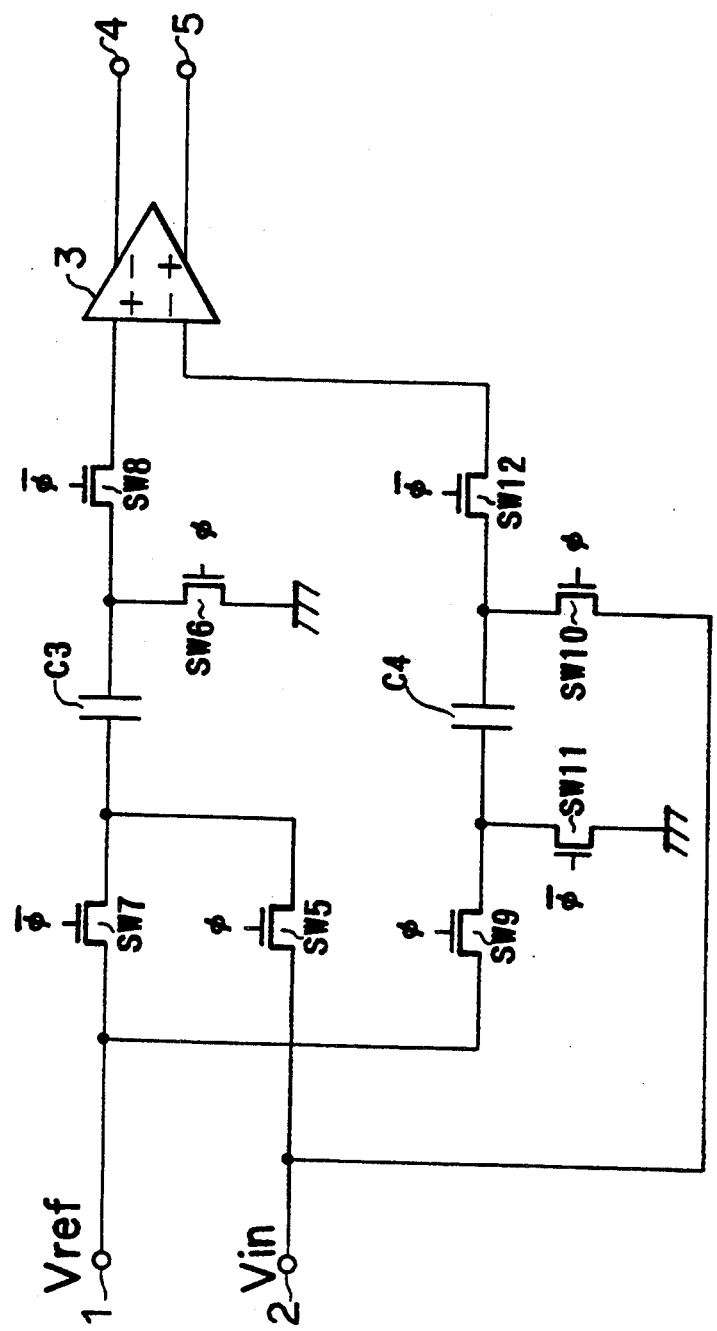
FIG. 3 is a circuit diagram illustrating a first embodiment of the voltage comparator circuit according to the present invention.

Before the description of embodiments of the present invention, a prior art voltage comparator circuit will now be explained with reference to FIGS. 1 and 2.

In FIG. 1, a reference voltage Vref at a reference voltage terminal 1 and an input voltage Vin at an input voltage terminal 3 are applied to a non-inverting input and an inverting input, respectively, of a differential amplifier 2 which, in this case, has two output terminals, i.e., an inverting output 4 and a non-inverting output 5.

Also, in order to compensate for an offset output voltage in the differential amplifier 3, capacitors C1 and C2, and four switches SW1, SW2, SW3 and SW4 which are formed by N-channel enhancement-type MOS transistors are provided. In this case, the switches SW1, SW3 and SW4 are turned ON by a clock signal $\phi$, and the switch SW2 is turned ON by a clock signal $\overline{\phi}$ opposite in phase to the clock signal $\phi$.

Referring to FIGS. 2A and 2B, when the clock signals $\phi$ and $\overline{\phi}$ are high and low, respectively, i.e., in phases P1, P3, ..., the switches SW1, SW3 and SW4 are turned ON and the switch SW2 is turned OFF. As a result, the reference voltage Vref is applied to the two inputs of the differential amplifier 3, so that the difference in potential between the two inputs is zero, while the output terminals 4 and 5 are grounded. Therefore, offset voltages $\Delta V_1$ and $\Delta V_2(\approx -\Delta V_1)$ are sampled at the capacitors C1 and C2, respectively.

Next, when the clock signals $\phi$ and $\overline{\phi}$ are low and high, respectively, i.e., in phases P2, P4, ..., the switch SW2 is turned ON and the switches SW1, SW3 and SW4 are turned OFF. As a result, the reference voltage Vref is applied to the non-inverting input of the differential amplifier 3, and the input voltage Vin is applied to the inverting input of the differential amplifier 3. Therefore, a difference Vref−Vin is amplified by the differential amplifier 3 which generates −A(Vref−Vin) and A(Vref−Vin) at its inverting output and non-inverting output, respectively, where A is an amplification factor. In this case, since the switches SW3 and SW4 are turned OFF, the voltages at the outputs 4 and 5 due to the capacitive coupling are −A(Vref−Vin)−$\Delta V_1$, and A(Vref−Vin)−$\Delta V_2$, respectively. Thus, the outputs of the differential amplifier 3 are compensated for by the offset voltage thereof.

In the differential amplifier 3, however, when the difference Vref−Vin is very small, noise is applied to at least one of the inputs of the differential amplifier 3, thereby inverting the output thereof. That is, the differential amplifier 3 is erroneously operated.

In FIG. 3, which illustrates a first embodiment of the present invention, the reference voltage Vref at the reference voltage terminal 1 and the input voltage Vin at the input voltage terminal 2 are applied via capacitors C3 and C4 to the non-inverting input and the inverting input, respectively, of the differential amplifier 3.

The capacitor C3 is controlled by switches SW5 to SW8 which are formed by N-channel enhancement-type MOS transistors, to thereby sample a difference Vref−Vin between the reference voltage Vref and the input voltage Vin. Note that the switches SW5 to SW8 are also controlled by the clock signals $\phi$ and $\overline{\phi}$ as shown in FIGS. 2A and 2B.

Referring to FIGS. 2A and 2B, when the clock signals $\phi$ and $\overline{\phi}$ are high and low, respectively, i.e., in the phases P1, P3, ..., the switches SW5 and SW6 are turned ON and the switches SW7 and SW8 are turned OFF. As a result, a difference in potential between the electrodes of the capacitor C3 is −Vin. Next, when the clock signals $\phi$ and $\overline{\phi}$ are low and high, respectively, i.e., in the phases P2, P4, ..., the switches SW7 and SW8 are turned ON and the SW5 and SW6 are turned OFF. As a result, the voltage at the non-inverting input of the differential amplifier 3 becomes −Vin+Vref=−Vref−Vin.

The capacitor C4 is controlled by switches SW9 to SW12 which are also formed by N-channel enhancement-type MOS transistors, to thereby sample a difference Vin−Vref between the input voltage Vin and the reference voltage Vref. Note that the switches SW9 to SW12 are also controlled by the clock signals $\phi$ and $\overline{\phi}$ as shown in FIGS. 2A and 2B.

Referring to FIGS. 2A and 2B, when the clock signals $\phi$ and $\overline{\phi}$ are high and low, respectively, i.e., in the phases P1, P3, ..., the switches SW9 and SW10 are turned ON and the switches SW11 and SW12 are turned OFF. As a result, the difference in potential between the electrodes of the capacitor C3 is Vin−Vref. Next, when the clock signals $\phi$ and $\overline{\phi}$ are low and high, respectively, i.e., in the phases P2, P4, ..., the switches SW11 and SW12 are turned ON and the SW9 and SW10 are turned OFF. As a result, the voltage at the inverting input of the differential amplifier 3 becomes Vin−Vref.

Thus, the difference in potential between the non-inverting input and inverting input of the differential amplifier 3 is 2×(Vref−Vin), and as a result, the voltage 2×(Vref−Vin) is amplified by the differential amplifier 3, so that the amplified voltages are generated in the outputs thereof.

Figure 4:
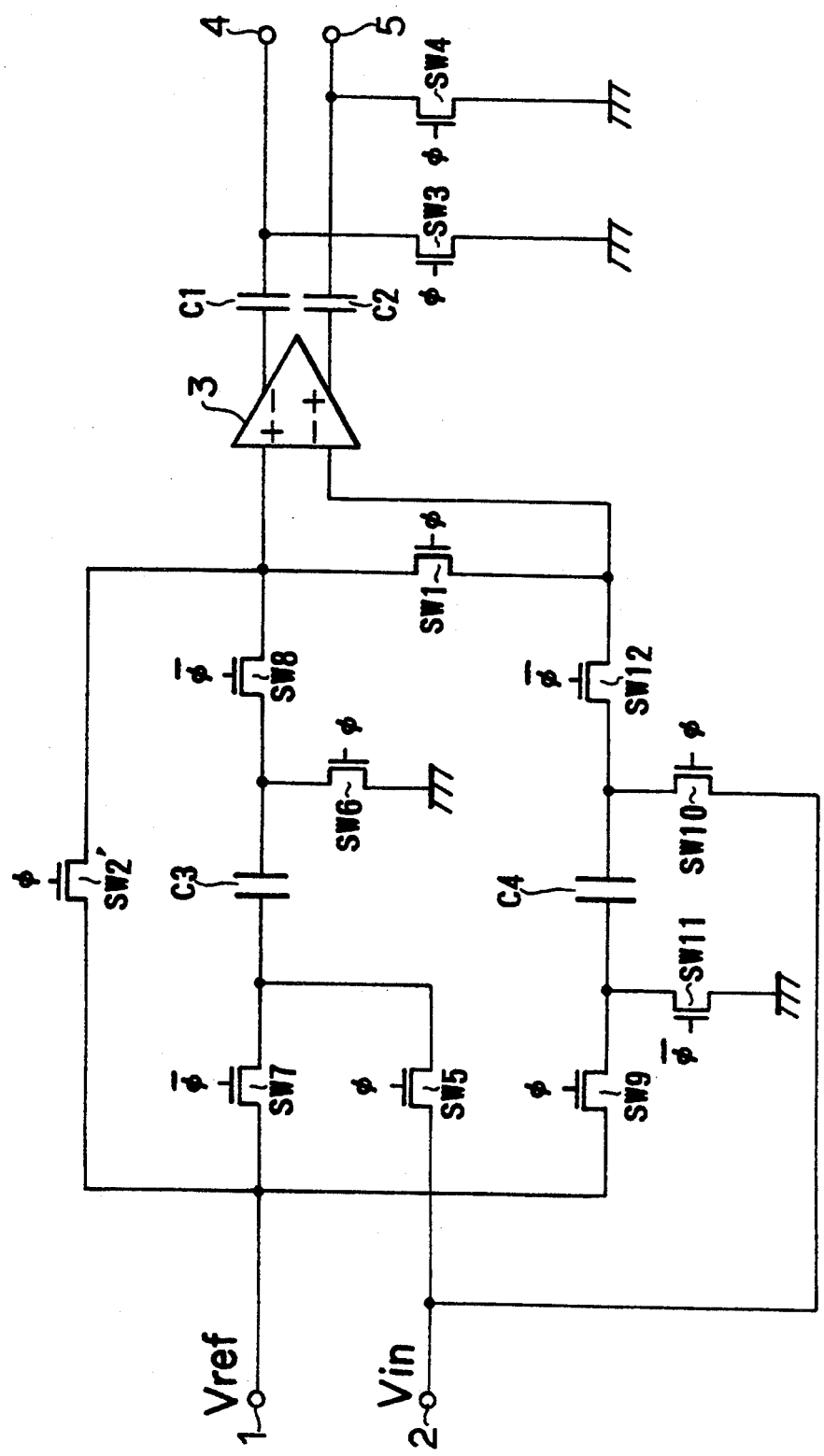
FIG. 4 is a circuit diagram illustrating a second embodiment of the voltage comparator circuit according to the present invention.

In FIG. 4, which illustrates a second embodiment of the present invention, the capacitors C1 and C2 and the switches SW1, SW3 and SW4 of FIG. 1 and a switch SW2' are added to the elements of FIG. 3, to thereby compensate for the outputs of the differential amplifier 3 with their offset voltages. That is, when the clock signal $\phi$ is high, i.e., in the phases P1, P3, ..., the switches SW1, SW2', SW3 and SW4 are turned ON. As a result, the reference voltage Vref is applied to the two inputs of the differential amplifier 3, i.e., the difference in potential therebetween is zero, and offset voltages $\Delta V_1$ and $\Delta V_2 (\approx -\Delta V_1)$ are sampled at the capacitors C1 and C2, respectively. Next, when the clock signal $\phi$ is low, i.e., in the phases P2, P4, ..., the switches SW1, SW2', SW3 and SW4 are turned OFF. In this case, although the differential amplifier 3 generates the amplified output voltages −2A(Vref−Vin) and 2A(Vref−Vin) at its inverting output and non-inverting output, these voltages are compensated for by the offset voltages $\Delta V_1$ and $\Delta V_2$, respectively. Therefore, these voltages are actually −2A(Vref−Vin)−$\Delta V_1$ and 2A(Vref−Vin)−$\Delta V_2$.

Figure 5:
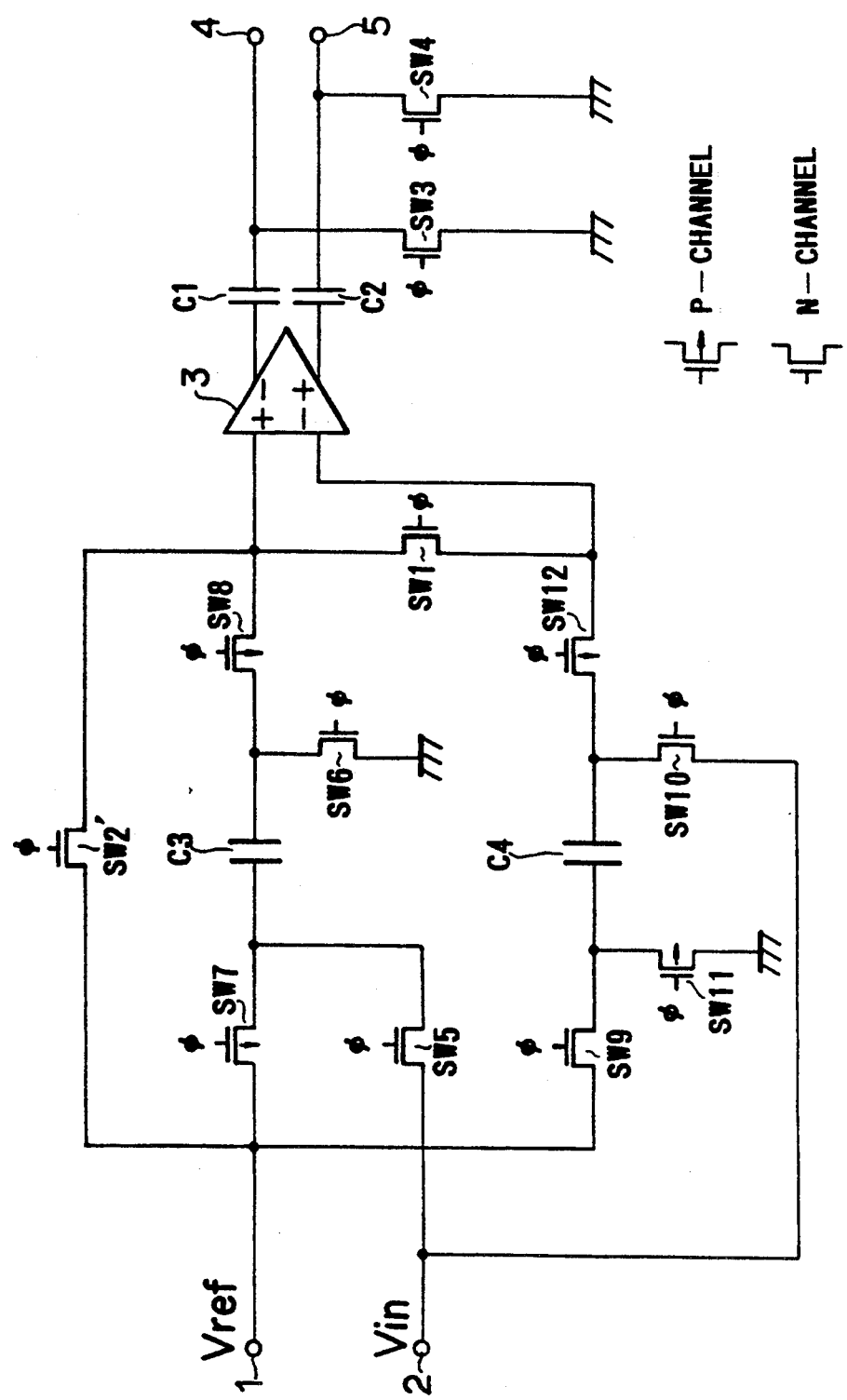
FIG. 5 is a modification of FIG. 4.

In the above-mentioned embodiments, all of the switches are formed by N-channel enhancement type MOS transistors, however, some of the switches such as SW1, SW2', SW3, SW4, SW5, SW6, SW9 and SW10 can be formed by N-channel enhancement-type MOS transistors and the other switches can be formed by P-channel enhancement-type MOS transistors, as illustrated in FIG. 5 which is a modification of FIG. 4. In this case, all of the switches can be controlled by a single clock signal such as $\phi$. Further, all of the switches can be formed by transfer gates each including a P-channel enhancement-type MOS transistor and an N-channel enhancement-type MOS transistor.

Figure 6:
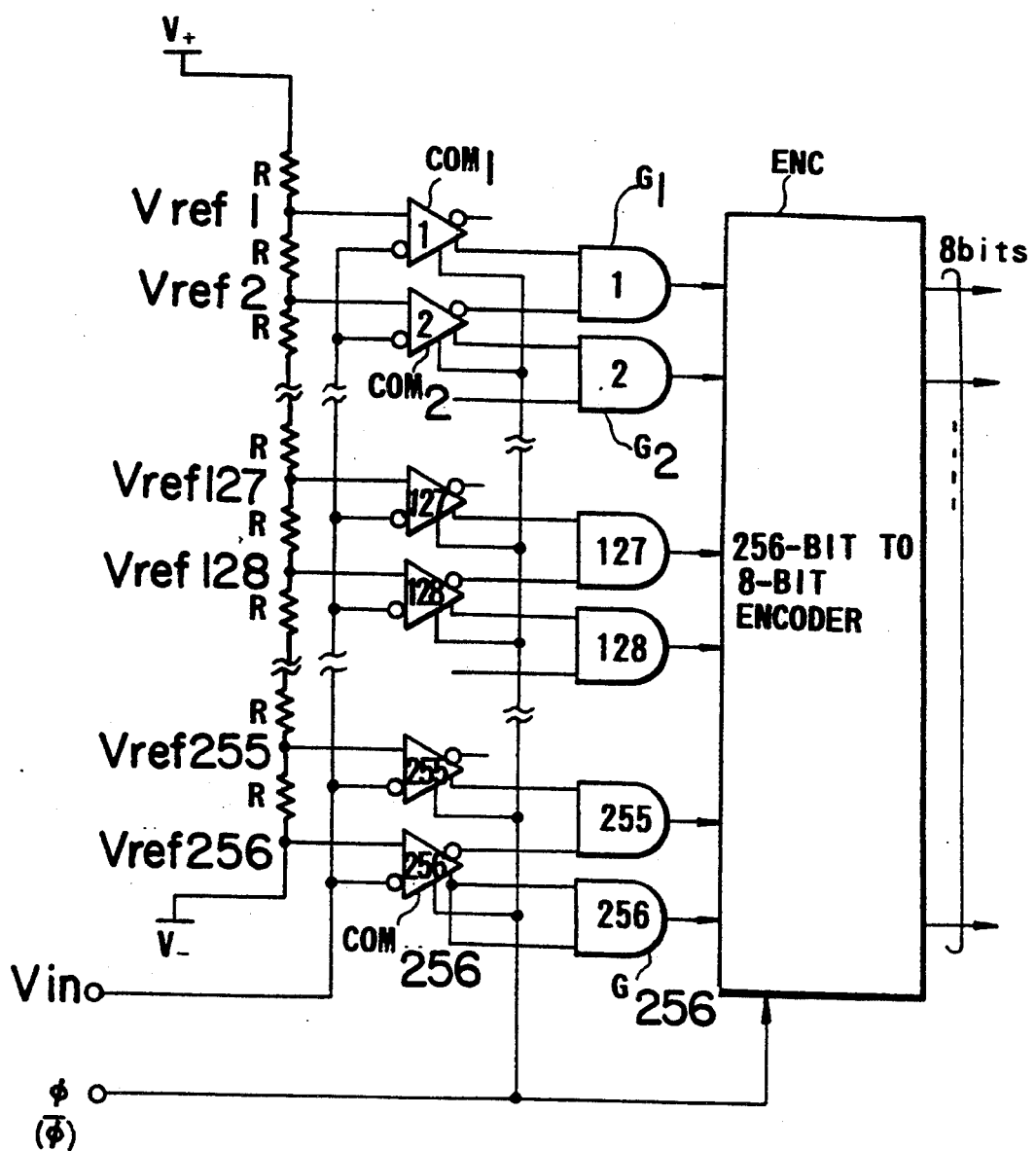
FIG. 6 is a block circuit diagram illustrating a flash-type analog/digital(A/D) converter to which the voltage comparator circuit according to the present invention is applied.

Also, in the above-mentioned embodiments, the voltage comparator circuit has two complementary outputs. This type of voltage comparator circuit can be applied to a flash-type A/D converter as illustrated in FIG. 6. In FIG. 6, references $COM_1$, $COM_2$, ..., $COM_{256}$ designate voltage comparator circuits to which the voltage comparator circuit according to the present invention is applied; $G_1$, $G_2$, ..., $G_{256}$ are AND circuits; and ENC is a 256-bit to 8-bit encoder for generating 8-bit parallel data. However, the number of outputs of the voltage comparator circuit according to the present invention can be one.

As explained hereinbefore, according to the present invention, since twice the difference between the reference voltage and the input voltage is applied to the differential amplifier, the sensitivity of the differential amplifier to noise and offset voltage can be reduced. In other words, erroneous operation of the differential amplifier can be avoided.

I claim:

1. A voltage comparator circuit comprising:
 a first voltage terminal;
 a second voltage terminal;
 a first voltage sampling means, connected to said first and second voltage terminals, for sampling the voltage at said first voltage terminal minus the voltage at said second voltage terminal;
 a second voltage sampling means, connected to said first and second voltage terminals, for sampling the voltage at said second voltage terminal minus the voltage at said first voltage terminal;
 a differential amplifier, connected to said first and second voltage sampling means, for amplifying the difference in potential between the outputs of said first and second voltage sampling means; and
 a ground terminal;
 said first voltage sampling means comprising:
 a first capacitor having first and second electrodes;
 a first switch connected between said second voltage terminal and the first electrode of said first capacitor;
 a second switch connected between the second electrode of said first capacitor and said ground terminal;
 a third switch connected between said first voltage terminal and the first electrode of said first capacitor; and
 a fourth switch connected between the second electrode of said first capacitor and a first input of said differential amplifier,
 said second voltage sampling means comprising:
 a second capacitor having first and second electrodes;
 a fifth switch connected between said first voltage terminal and the first electrode of said second capacitor;
 a sixth switch connected between said second voltage terminal and the second electrode of said second capacitor;
 a seventh switch connected between the first electrode of said second capacitor and said ground terminal; and
 an eighth switch connected between the second electrode of said second capacitor and the second input of said differential amplifier, said first, second, fifth and sixth switches being turned ON when said third, fourth, seventh and eighth switches are turned OFF, said first, second, fifth and sixth switches being turned OFF when said third, fourth, seventh and eighth switches are turned ON.

2. A circuit as forth in claim 1, wherein said first, second, fifth and sixth switches are turned ON and OFF in accordance with a first clock signal, said third, fourth, seventh and eighth switches being turned ON and OFF in accordance with a second clock signal having an opposite phase to that of said first clock signal.

3. A circuit as forth in claim 1, wherein said first, second, fifth and sixth switches are complementary switches to said third, fourth, seventh and eighth switches, said first to eighth switches being turned ON and OFF in accordance with a single clock signal.

4. A voltage comparator circuit comprising:
a first voltage terminal;
a second voltage terminal;
a first voltage sampling means, connected to said first and second voltage terminals, for sampling the voltage at said first voltage terminal minus the voltage at said second voltage terminal;
a second voltage sampling means, connected to said first and second voltage terminals, for sampling the voltage at said second voltage terminal minus the voltage at said first voltage terminal;
a differential amplifier, connected to said first and second voltage sampling means, for amplifying the difference in potential between the outputs of said first and second voltage sampling means;
means, connected to the first and second inputs of said differential amplifier, for applying the same voltage thereto; and
means, connected to an output of said differential amplifier, for sampling an offset voltage thereat when the same voltage is applied to the first and second inputs of said differential amplifier, thereby compensating for the output of said differential amplifier with the sampled offset voltage.

5. A circuit as set forth in claim 4, wherein the same voltage applying means comprises:
a first switch connected between said first voltage terminal and the first input of said differential amplifier, and
a second switch connected between the first and second inputs of said differential amplifier;
said offset voltage sampling means comprising:
a capacitor having a first electrode connected to the output of said differential amplifier,
a ground terminal, and
a switch connected between a second electrode of said capacitor and said ground terminal,
the offset voltage being sampled when said first and second switches of said same voltage applying means and the switch of said offset voltage sampling means are turned ON.

6. A voltage comparator circuit comprising:
an reference voltage terminal;
a input voltage terminal;
an ground terminal;
a differential amplifier having first and second inputs, and an output;
a first capacitor having first and second electrodes;
a second capacitor having first and second electrodes;

a first switch connected between said input voltage terminal and the first electrode of said first capacitor;
a second switch connected between the second electrode of said first capacitor and said ground terminal;
a third switch connected between said reference voltage terminal and the first electrode of said first capacitor;
a fourth switch connected between the second electrode of said first capacitor and the first input of said differential amplifier;
a fifth switch connected between said reference voltage terminal and the first electrode of said second capacitor;
a sixth switch connected between said input voltage terminal and the second electrode of said second capacitor;
a seventh switch connected between the first electrode of said second capacitor and said ground terminal; and
an eighth switch connected between the second electrode of said second capacitor and a second input of said differential amplifier,
said first, second, fifth and sixth switches being turned ON when said third, fourth, seventh and eighth switches are turned OFF,
said first, second, fifth and sixth switches being turned OFF when said third, fourth, seventh and eighth switches are turned ON.

7. A circuit as forth in claim 6, wherein said first, second, fifth and sixth switches are turned ON and OFF in accordance with a first clock signal,
said third, fourth, seventh and eighth switches being turned ON and OFF in accordance with a second clock signal having an opposite phase to that of said first clock signal.

8. A circuit as forth in claim 6, wherein said first, second, fifth and sixth switches are complementary switches to said third, fourth, seventh and eighth switches,
said first to and eighth switches being turned ON and OFF in accordance with a single clock signal.

9. A circuit as set forth in claim 6, further comprising:
means, connected to the first and second inputs of said differential amplifier, for applying the same voltage thereto; and
means, connected to an output of said differential amplifier, for sampling an offset voltage thereat when the same voltage is applied to the first and second inputs of said differential amplifier, thereby compensating for the output of said differential amplifier with the sampled offset voltage.

10. A circuit as set forth in claim 9, wherein the same voltage applying means comprises:
a ninth switch connected between said reference voltage terminal and the first input of said differential amplifier; and
a tenth switch connected between the first and second inputs of said differential amplifier;
said offset voltage sampling means comprising:
a third capacitor having a first electrode connected to the output of said differential amplifier; and
an eleventh switch connected between a second electrode of said third capacitor and said ground terminal,
the offset voltage being sampled when said ninth, tenth and eleventh switches are turned ON.

* * * * *